(12) United States Patent
Pamart et al.

(10) Patent No.: US 12,100,916 B2
(45) Date of Patent: Sep. 24, 2024

(54) TEMPERATURE MEASURING DEVICE FOR MEASURING THE TEMPERATURE OF A TERMINAL OF AN ELECTRICAL CONNECTOR

(71) Applicant: Tyco Electronics France SAS, Pontoise (FR)

(72) Inventors: Olivier Pamart, Pontoise (FR); Eric Chatelus, Pontoise (FR); Bruno Dupont, Pontoise (FR); Jose Ferreira, Pontoise (FR)

(73) Assignee: Tyco Electronics France SAS, Pontoise (FR)

( * ) Notice: Subject to any disclaimer, the term of this patent is extended or adjusted under 35 U.S.C. 154(b) by 266 days.

(21) Appl. No.: 17/723,952

(22) Filed: Apr. 19, 2022

(65) Prior Publication Data

US 2022/0337005 A1 Oct. 20, 2022

(30) Foreign Application Priority Data

Apr. 19, 2021 (FR) ........................................ 2104062

(51) Int. Cl.
*H01R 13/66* (2006.01)
*G01K 7/02* (2021.01)
(Continued)

(52) U.S. Cl.
CPC ......... *H01R 13/6683* (2013.01); *G01K 7/023* (2013.01); *H01R 12/52* (2013.01); *H01R 13/2407* (2013.01); *H01R 2201/26* (2013.01)

(58) Field of Classification Search
CPC ........................... H01R 13/6683; H01R 12/52; H01R 13/2407; H01R 2201/26; H01R 13/04;
(Continued)

(56) References Cited

U.S. PATENT DOCUMENTS 7,815,998 B2 * 10/2010 Simpson ................ C08J 9/0066
427/547
8,124,885 B2 * 2/2012 Yamada ............. H01R 12/7082
174/265
(Continued)

FOREIGN PATENT DOCUMENTS

DE 102018120057 A1 2/2019
EP 2117082 A1 10/2006
(Continued)

OTHER PUBLICATIONS

French Opinion, Application No. FR2104062, Dated: Apr. 19, 2021, 10 pages.
(Continued)

*Primary Examiner* — Alexander Gilman
(74) *Attorney, Agent, or Firm* — Barley Snyder

(57) ABSTRACT

A temperature measuring device for measuring a temperature of a terminal of an electrical connector includes a printed circuit board, a temperature sensor mounted on the printed circuit board, and a thermally conductive sleeve having a first thermally conductive portion and a second thermally conductive portion. The first thermally conductive portion has a recess receiving a part of the printed circuit board. The first thermally conductive portion is in thermal contact with the temperature sensor. The second thermally conductive portion forms a flexible tab extending from the first thermally conductive portion and contacting the terminal.

14 Claims, 9 Drawing Sheets

(51) Int. Cl.
*H01R 12/52* (2011.01)
*H01R 13/24* (2006.01)

(58) Field of Classification Search
CPC ...... G01K 7/023; G01K 2205/00; G01K 1/16;
G01K 1/14; G01K 13/00; B60L 2240/36;
B60L 53/16; H05K 1/181; H05K
2201/09081; H05K 2201/10151; Y02T
10/70; Y02T 10/7072; Y02T 90/14
USPC .......................................................... 439/102
See application file for complete search history.

(56) References Cited

U.S. PATENT DOCUMENTS

| | | | | |
|---|---|---|---|---|
| 8,419,448 | B2* | 4/2013 | Konno | H01R 43/007 439/86 |
| 2004/0192080 | A1* | 9/2004 | Li | H01L 24/72 257/E23.068 |
| 2011/0318961 | A1* | 12/2011 | Konno | H01R 43/007 439/586 |
| 2019/0293493 | A1* | 9/2019 | Meissner | H01R 13/665 |
| 2019/0306996 | A1* | 10/2019 | Pusheck | G01D 11/245 |
| 2020/0094689 | A1* | 3/2020 | Myer | H01R 13/639 |
| 2021/0239539 | A1* | 8/2021 | Smitherman | G01K 1/08 |
| 2022/0337005 | A1* | 10/2022 | Pamart | H01R 13/2407 |

FOREIGN PATENT DOCUMENTS

| | | |
|---|---|---|
| JP | S6138529 U | 3/1986 |
| JP | H854291 A | 2/1996 |
| JP | 2007132692 A | 5/2007 |
| JP | 2019168450 A | 10/2019 |

OTHER PUBLICATIONS

Office Action from the Japanese Patent Office dated Feb. 14, 2023, corresponding to Application No. 2022-057855 with English translation, 13 pages.

Extended European Search Report, Application No. 22168366.7-1001, Dated: May 3, 2022, 9 pages.

* cited by examiner

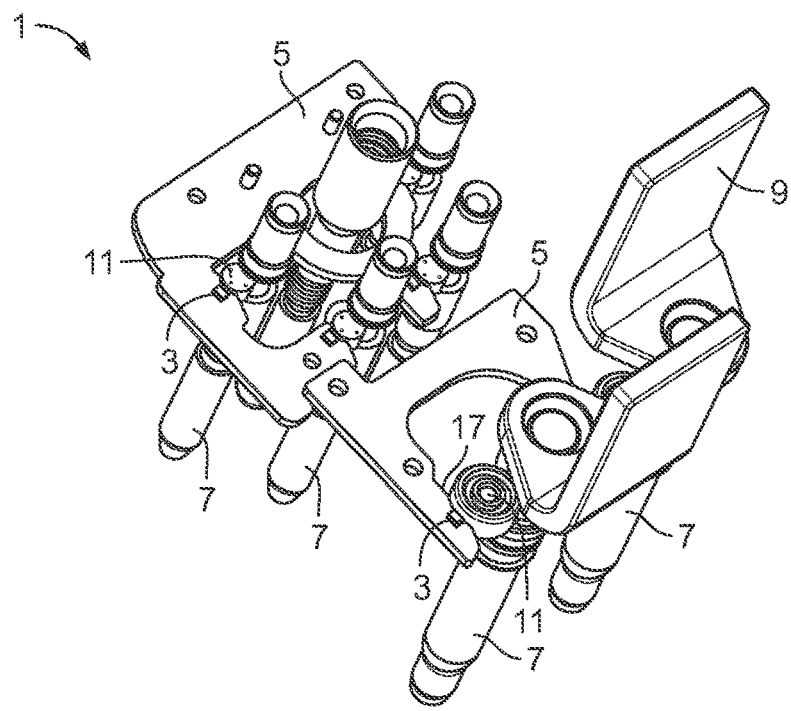
Fig. 1A - PRIOR ART
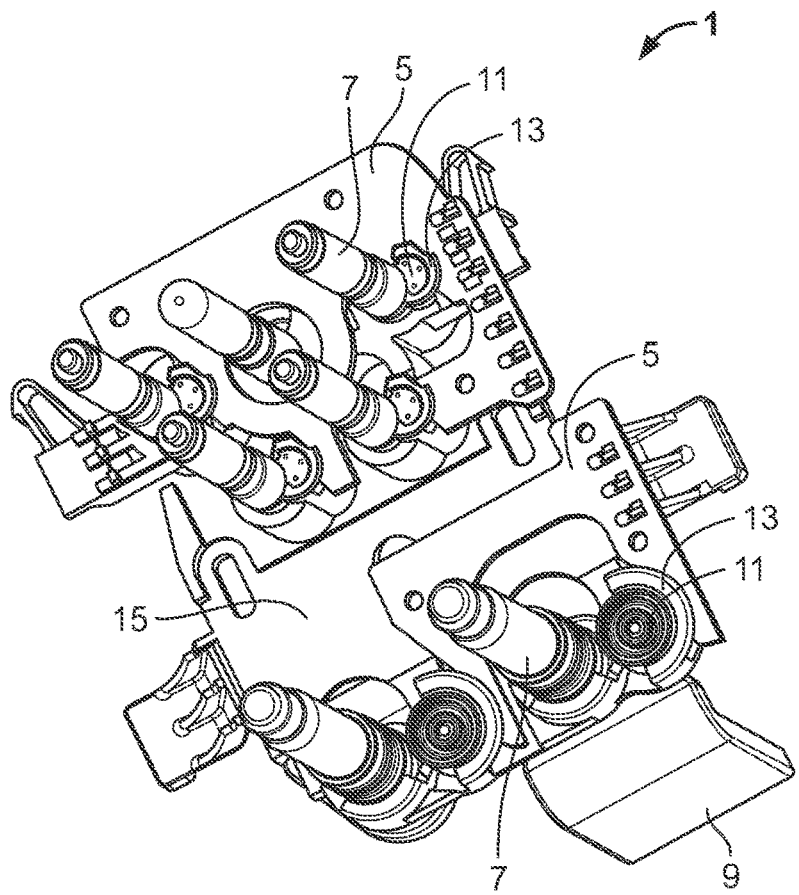
Fig. 1B - PRIOR ART

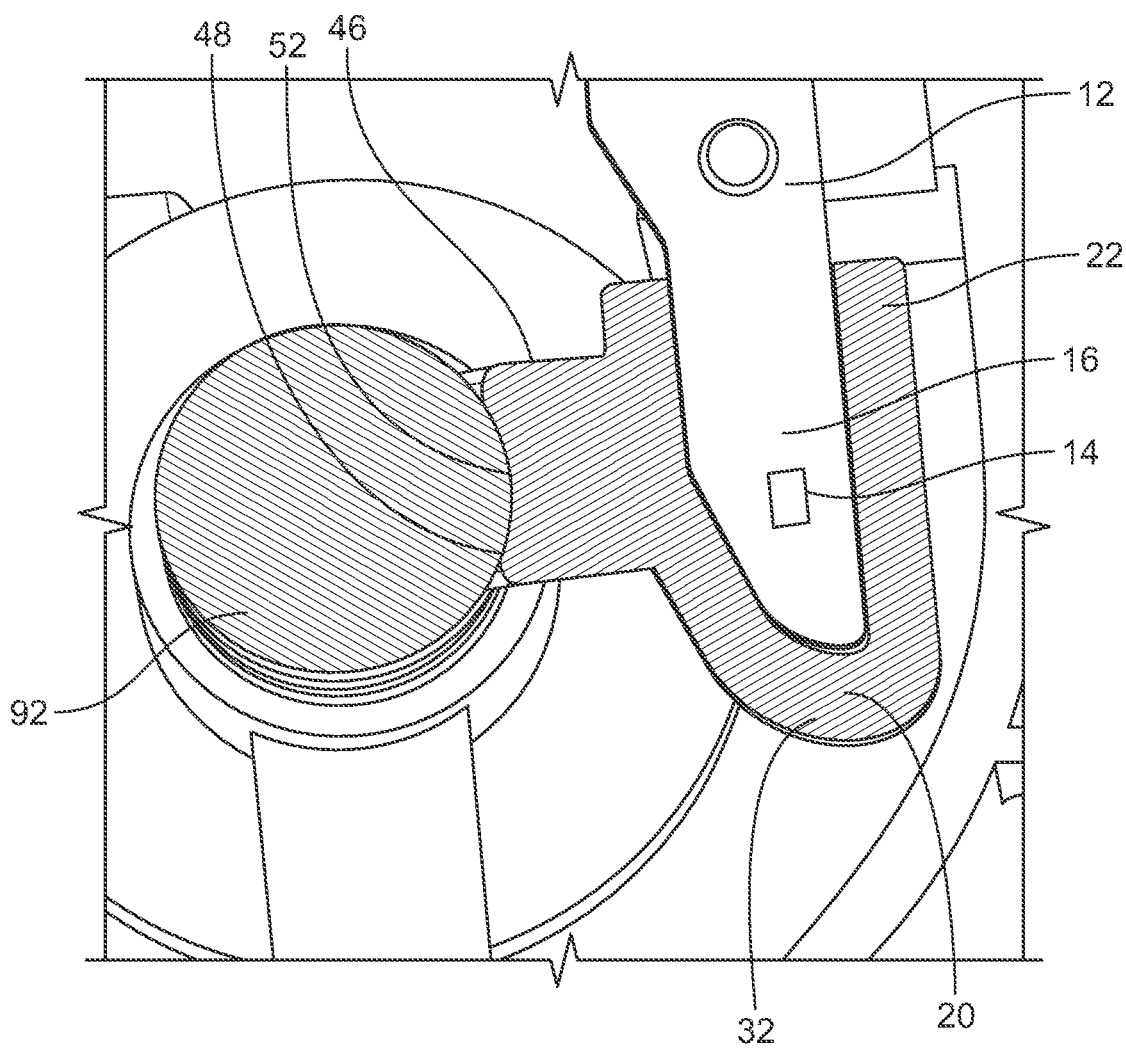
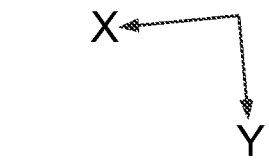

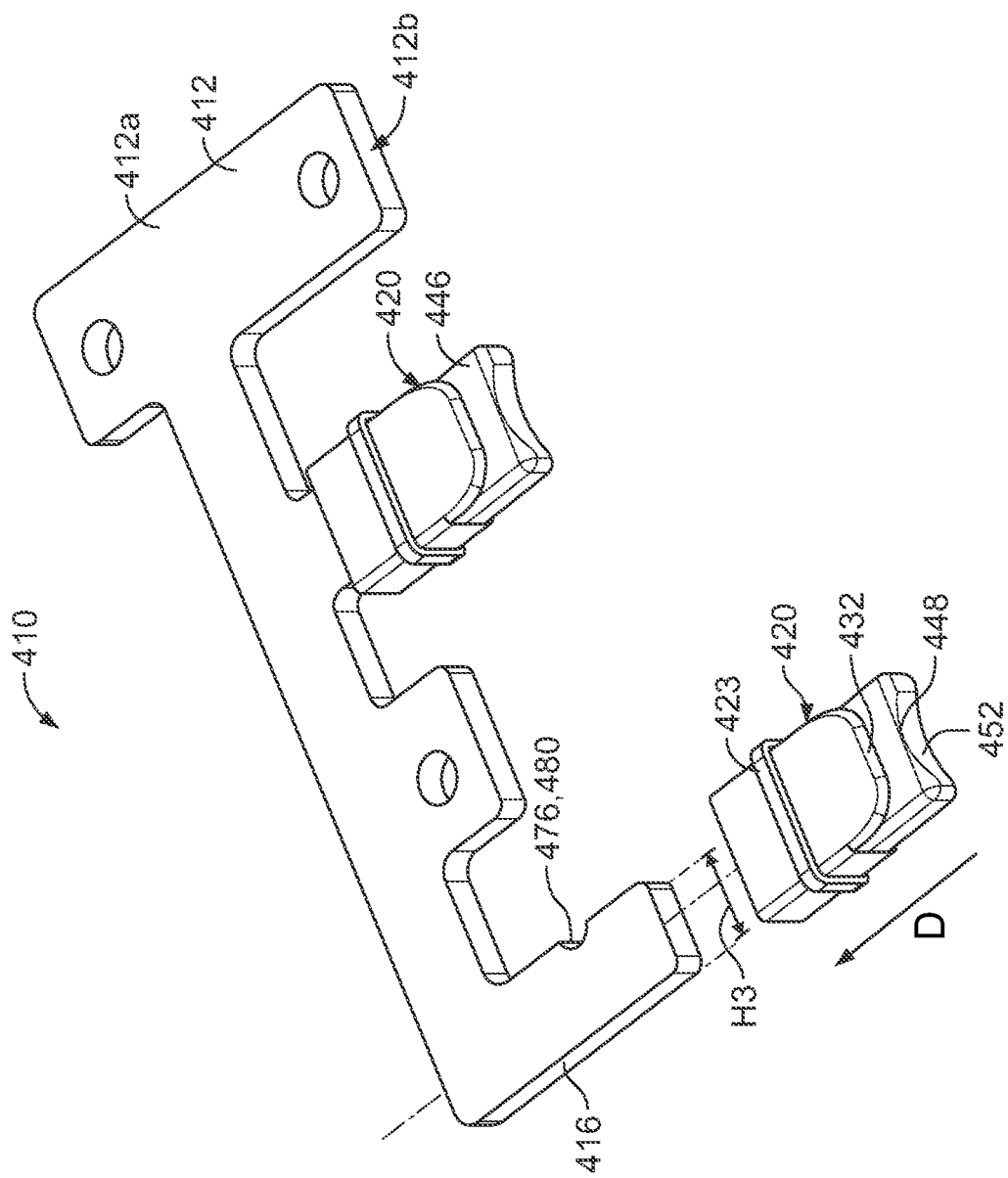

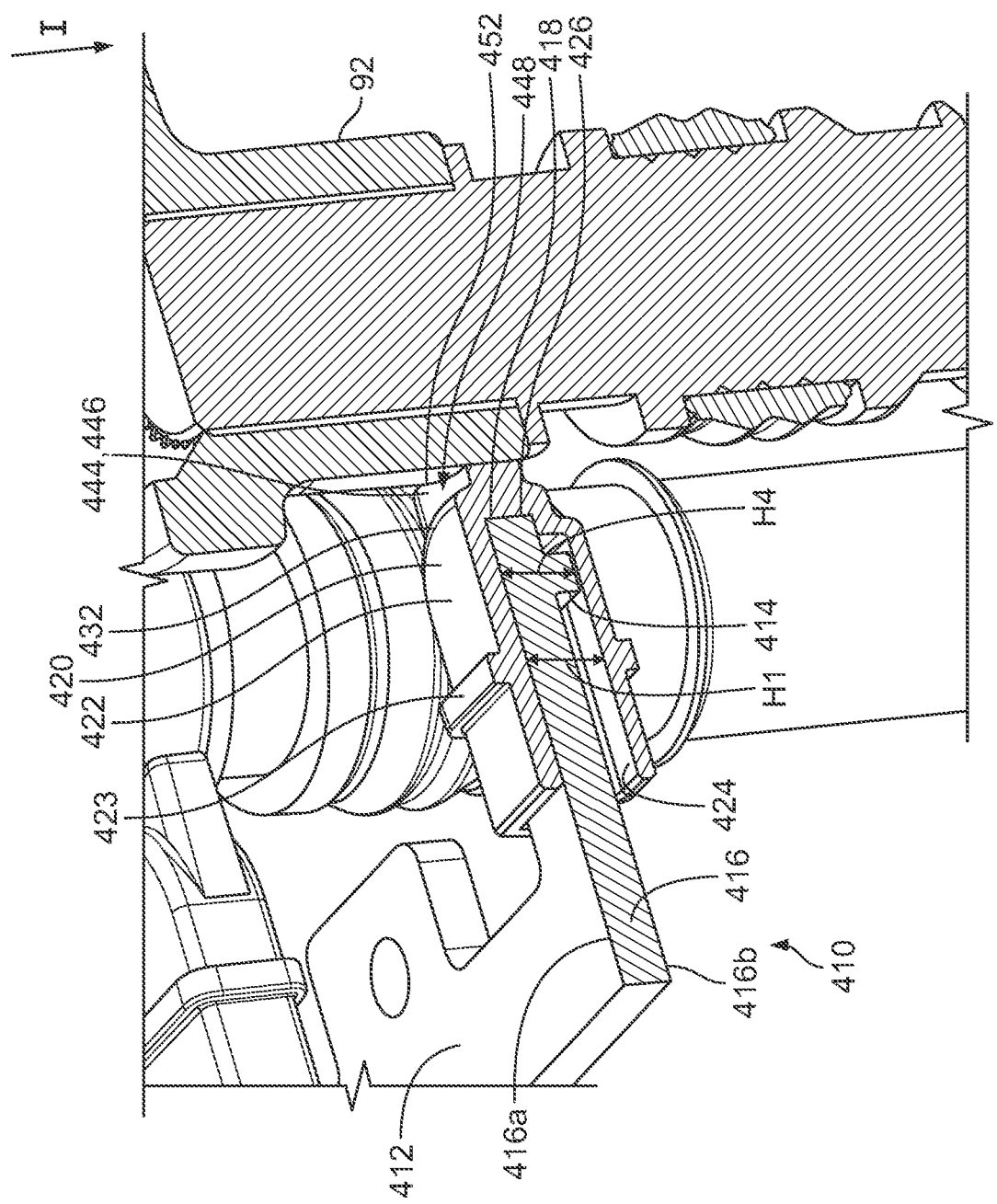

TEMPERATURE MEASURING DEVICE FOR MEASURING THE TEMPERATURE OF A TERMINAL OF AN ELECTRICAL CONNECTOR

CROSS-REFERENCE TO RELATED APPLICATION

This application claims the benefit of the filing date under 35 U.S.C. § 119(a)-(d) of French Patent Application No. 2104062, filed on Apr. 19, 2021.

FIELD OF THE INVENTION

The present invention relates to a temperature measuring device and, more particularly, to a temperature measuring device for measuring the temperature of a terminal of an electrical connector and comprising a thermally conductive sleeve.

BACKGROUND

In the field of electric vehicles, among others, it is necessary to monitor the temperature of certain components to which an electrical voltage is applied. This is even more necessary for the fast charging of electric vehicles. Indeed, a high power, up to 200 A or more, at voltages above 200V, or even 1000V (i.e. high voltage), is required. Under high current conditions (especially with values of 200 A or more), the vehicle's electrical circuits are more prone to temperature rises. For safety reasons, the temperature of these components should be measured.

The temperature of an electrical component, such as a terminal of an electrical connector in an electric vehicle, is measured by a temperature sensor. It is known in the prior art, as shown in the assembly 1 illustrated in FIG. 1A, to weld or solder temperature sensors 3 to a printed circuit board 5. In order to allow thermal transfer from a terminal 7 of an electrical connector 9 to each temperature sensor 3, a thermally conductive disk 11 is interposed between each terminal 7 and each temperature sensor 3. The thermally conductive disk 11 makes thermal contact with the terminal 7 and with the temperature sensor 3. Thermal transfer from the terminal 7 to the temperature sensor 3 is then made possible via the thermally conductive disk 11. Thus, the temperature sensor 3 is able to measure the temperature of the terminal 7.

However, in order to hold the thermally conductive disks 11 in place, it is necessary to partially accommodate the thermally conductive disks 11 in semicircular-shaped receptacles 13 of a holding piece 15 made of plastic and shown in FIG. 1B. The thermally conductive disks 11 are then held by the holding piece 15 and squeezed between the printed circuit board 5 and each terminal 7. During the heat transfer from the terminal 7 to the temperature sensor 3, heat is dissipated in the holding piece 15, which affects the quality and sensitivity of the temperature measurement.

Furthermore, the arrangement shown in FIGS. 1A and 1B involves the temperature sensor 3 mounted sufficiently close to an edge 17 of the printed circuit board 5 so that the temperature sensor 3 can make thermal contact with the thermally conductive disk 11. However, in high voltage applications, especially above 200V or even 1000V, it is necessary, for safety reasons, to provide a rather long creepage distance between the terminal 7 and the electrical components, such as the temperature sensor 3, of the printed circuit board 5. A creepage distance corresponds to the shortest path between two conductive components across the surface of a printed circuit board. The arrangement of the assembly 1 of the prior art is not well-adapted for allowing a suitable creepage distance for high voltage applications.

SUMMARY

A temperature measuring device for measuring a temperature of a terminal of an electrical connector includes a printed circuit board, a temperature sensor mounted on the printed circuit board, and a thermally conductive sleeve having a first thermally conductive portion and a second thermally conductive portion. The first thermally conductive portion has a recess receiving a part of the printed circuit board. The first thermally conductive portion is in thermal contact with the temperature sensor. The second thermally conductive portion forms a flexible tab extending from the first thermally conductive portion and contacting the terminal.

BRIEF DESCRIPTION OF THE DRAWINGS

The invention will now be described by way of example with reference to the accompanying Figures, of which:

FIG. 1A is a perspective view of an assembly comprising a terminal of an electrical connector and a temperature measuring device according to the prior art;

FIG. 1B is a perspective view of the prior art assembly shown in FIG. 1A and a holding piece according to the prior art;

FIG. 8 is a sectional top view of the assembly of FIG. 7;

FIG. 9 is a perspective view of a temperature measuring device according to a seventh embodiment;

FIG. 11 is a sectional perspective view of an assembly comprising a terminal of an electrical connector and the temperature measuring device according to the seventh embodiment of the invention.

DETAILED DESCRIPTION OF THE EMBODIMENT(S)

The invention will now be described in more detail using embodiments in an exemplary manner and with reference to the figures. The embodiments described are merely possible configurations and it should be kept in mind that individual features may be provided independently of each other or may be omitted altogether when implementing the present invention.

Figure 2:
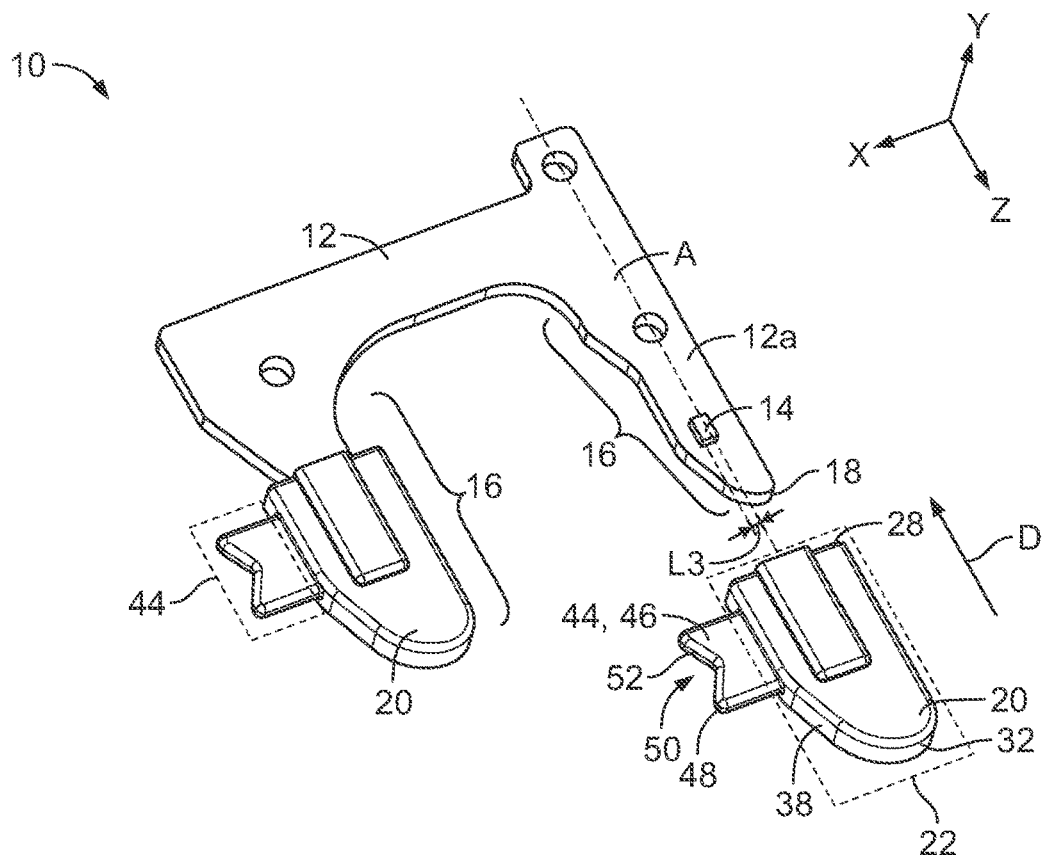
FIG. 2 is a perspective view of a temperature measuring device according to a first embodiment.

FIG. 2 illustrates a temperature measuring device 10 according to a first embodiment of the invention. Such a temperature measuring device 10 is intended to measure the temperature of a conductive component, in particular of a terminal of an electrical connector.

The temperature measurement device 10 comprises a printed circuit board (PCB) 12 having at least one temperature sensor 14 mounted thereon (only one temperature sensor 14 is visible in FIG. 2). The temperature sensor 14 is mounted on a face 12a of the PCB 12. In one embodiment, the temperature sensor 14 may be mounted on a face geometrically opposite the face 12a.

In an embodiment, the temperature sensor 14 is welded or soldered to a part 16 of the PCB 12 that has an elongated shape extending along a longitudinal axis A. The part 16 shown in FIG. 2 has an oblong shape along the longitudinal axis A. The part 16 terminates along the longitudinal axis A with a free end 18 that has a curved contour in the plane of the circuit board 12. The plane of the circuit board 12 is parallel to the plane (XY) in the illustration in FIG. 2.

In another embodiment, like the embodiment shown in FIG. 9 and described in more detail below, the part 16 may have a rectangular shape along the longitudinal axis A.

As shown in FIG. 2, the temperature measuring device 10 comprises a thermally conductive sleeve 20. The term "thermally conductive" means that the sleeve 20 is capable of diffusing heat, in other words, of effecting heat transfer, without macroscopic displacement of material.

According to the first embodiment, the sleeve 20 is a thermally conductive silicone sleeve 20, i.e., it is able to transfer heat but does not conduct electricity. It can thus serve as an electrical insulator. The thermally conductive silicone sleeve 20 is integrally formed, for example by molding. Silicone exhibits a very good elastic recovery, superior to that of other elastomers, and is therefore particularly suitable for forming the flexible tab of the sleeve 20. In addition, silicone has good dielectric properties and high temperature resistance. It is resistant to moisture and has good resistance to aging. This makes it particularly suitable for use in a temperature measuring device in an electric vehicle.

FIG. 2 illustrates the rightmost thermally conductive sleeve 20 in position to be slid, i.e. to be slidably engaged, to the part 16 of the printed circuit board 12 along an insertion direction D. The other thermally conductive sleeve 20, leftmost in FIG. 2, is already slid over a part 16 of the printed circuit board 12 so that the temperature sensor 14 is in thermal contact with the thermally conductive sleeve 20. The thermally conductive sleeve 20 is then in frictional engagement with the part 16 of the printed circuit board 12, thereby frictionally retaining the thermally conductive sleeve 20 to the printed circuit board 12. The thermally conductive sleeve 20 is then easily held to the printed circuit board 12 without the need for additional holding parts.

The thermally conductive sleeve 20 according to the first embodiment is further described in the following with reference to FIG. 2 as well as with reference to FIG. 3, which depicts a three-dimensional view of the thermally conductive sleeve 20 providing more detail.

Figure 3:
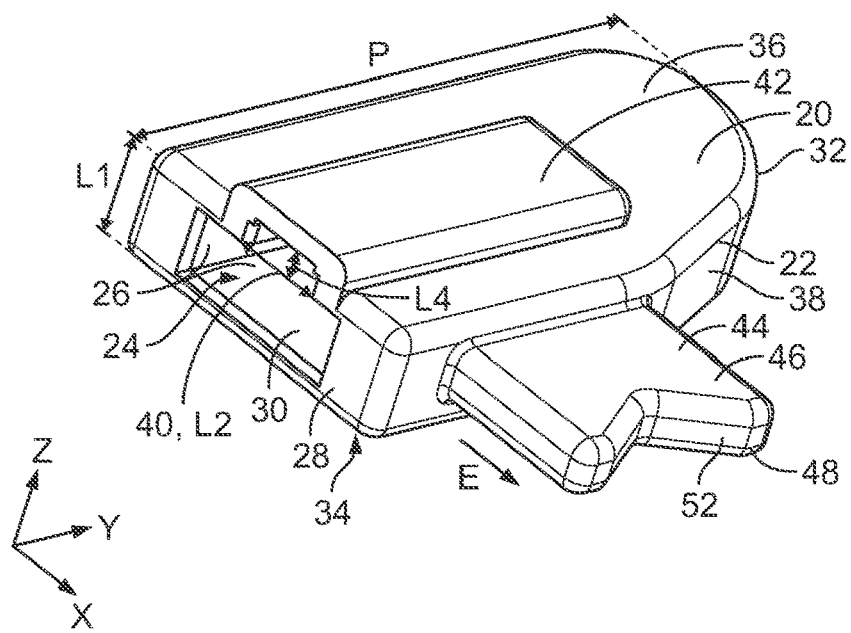
FIG. 3 is a perspective view of a thermally conductive sleeve of the temperature measuring device.

The thermally conductive sleeve 20 comprises a first thermally conductive portion 22, shown in FIGS. 2 and 3 and highlighted by a dotted box in FIG. 2. The first thermally conductive portion 22 comprises a recess 24 (visible in FIG. 3) into which the part 16 of the circuit board 12 can be slid. The dimensions of the recess 24 are thus adapted to the dimensions of the part 16 and the height of the temperature sensor 14.

The recess 24 is delimited by an inner wall 26 of the first thermally conductive portion 22. The recess 24 extends in depth along a depth direction P from a first end 28 of the first thermally conductive portion 22. The first end 28 of the first thermally conductive portion 22 thereby comprises an opening 30 that opens into the recess 24. The depth of the recess 24 is indicated by the letter "P" in FIG. 3. The depth P of the recess 24 extends from the first end 28 in a direction parallel to the Y-axis of the Cartesian coordinate system shown in FIG. 3. The depth P of the recess 24 is parallel to the insertion direction D (shown in FIG. 2).

The first thermally conductive portion 22 can thus be slid along the insertion direction D on the part 16 of the printed circuit board 12 over a length corresponding to the depth P of the recess 24. The length of the depth P can be defined, in particular increased, in order to improve the retention of the thermally conductive sleeve 20 or/and for increasing the creepage distance (by increasing the distance covered by the thermally conductive sleeve 20).

As explained above with reference to the leftmost thermally conductive sleeve 20 shown in FIG. 2, once the thermally conductive sleeve 20 is engaged (by sliding along the direction of insertion D) to the printed circuit board 12, there is a frictional contact, or frictional engagement, between a surface of the PCB's part 16 and an inner wall 26 of the recess 24 of the first thermally conductive portion 22. This frictional contact creates a frictional connection that serves to retain the thermally conductive sleeve 20 to the part 16 of the printed circuit board 12.

The first thermally conductive portion 22 has a second end 32 opposite the first end 28 along the depth direction P (i.e. along the Y-axis of the Cartesian coordinate system shown in FIG. 3). In the first embodiment, the second end 32 is a closed end 32, i.e. an end without an opening. The second closed end 32 allow reducing heat losses and thus improves heat transfer. The second closed end 32 can also serve as an indicator for an operator when mounting the thermally conductive sleeve 20 to the printed circuit board 12 because it provides a stop, like an abutment, which indicates to the operator that the thermally conductive sleeve 20 has been sufficiently slid over the part 16. This also increases the creepage distance from the electrical connector terminal, especially under high voltage, as more of the printed circuit board 12 surface is covered by the thermally conductive silicone sleeve 20.

The second closed end 32 implies that the recess 24 comprises a closed end (not visible in FIGS. 2 and 3) opposite the opening 30 along the depth P of the recess 24. Once the thermally conductive sleeve 20 is slid into a final position, as shown on the left of FIG. 2, the end 18 abuts against the inner wall 26 at said closed end 32 of the recess 24.

In a plane (XY) as shown in FIG. 3, the first thermally conductive portion 22 according to the first embodiment has a substantially rectangular shape at the first end 28 and a convex shape at the second end 32. In one embodiment the second end 32 may have a substantially rectangular shape.

The first thermally conductive portion 22 is substantially flat with a thickness L1 between two geometrically opposed walls 34, 36 that each extend in planes (XY) parallel to each other, as shown in FIG. 3. When the thermally conductive sleeve 20 is mounted on the PCB 12, as shown at left in FIG. 2, the walls 34, 36 extend in planes parallel to the plane (XY) in which the PCB 12 and its part 16 extend. The two opposing walls 34, 36 of the first thermally conductive portion 22 are joined together by a lateral side 38.

According to the first embodiment, the wall 36 of the first thermally conductive portion 22 comprises a groove 40 of width L2 (see FIG. 3). The groove 40 extends longitudinally along the depth direction P of the recess 24. The groove 40 extends in a direction parallel to the insertion direction D. The groove 40 opens into the recess 24. The width L2 (see FIG. 3) of the groove 40 is adapted to the width L3 (see FIG. 2) of the temperature sensor 14. Thus, the temperature sensor 14 can be received in the groove 40 of the thermally conductive sleeve 20 along the insertion direction D. The groove 40 allows receiving the temperature sensor 14: the groove 40 provides a dedicated housing specifically adapted to its dimensions. The temperature sensor 14 is thus less mechanically stressed when the thermally conductive sleeve 20 is inserted along the insertion direction D to the printed circuit board 12.

According to the first embodiment, a bottom 42 of the groove is 40 formed by the wall 36. The groove 40 has a height L4 (see FIG. 3) which corresponds to the height of the temperature sensor 14. Thus, according to the first embodiment, the temperature sensor 14 is integrally received in the first thermally conductive portion 22 of the thermally conductive sleeve 20. This not only protects the temperature sensor 14 from the surrounding environment, but also further improves the thermal contact between the temperature sensor 14 and the thermally conductive sleeve 20. A creepage distance is also increased, as more surface area of the printed circuit board 12 is covered by the thermally conductive sleeve 20.

According to the present invention, the thermally conductive sleeve 20 further comprises a second thermally conductive portion 44 indicated in FIGS. 2 and 3. The second thermally conductive portion 44 forms a flexible thermally conductive tab 46 that extends in an extension direction E from the first portion 22 for contacting a terminal of an electrical connector (shown in FIGS. 7 and 8).

The flexible tab 46, which has a substantially flat shape, extends in an extension plane. The plane of extension corresponds to the plane of extension (XY) in the embodiment of FIGS. 2 and 3. When the thermally conductive sleeve 20 is mounted on the circuit board 12, as shown in the left side of FIG. 2, the plane of extension of the flexible tab 46 is parallel to the plane (XY) in which the circuit board 12 and its part 16 extends. Because the tab 46 is flexible, it can be flexed, bent, and folded. Thus, the flexible tab 46 is flexible.

According to the first embodiment, the flexible tab 46 extends from the lateral side 38 of the first thermally conductive portion 22 to a free end 48 of the flexible tab 46. Accordingly, the extension direction E according to the first embodiment is perpendicular to the depth direction P of the recess 24 of the first thermally conductive portion 22 of the thermally conductive sleeve 20. Such an arrangement saves space in an installation because it allows the length of the thermally conductive sleeve 20 to be reduced compared to an embodiment in which a tab of the same length would extend in a direction parallel to the depth of the recess 24. Thus, a more compact solution is advantageously obtained.

Figure 10:
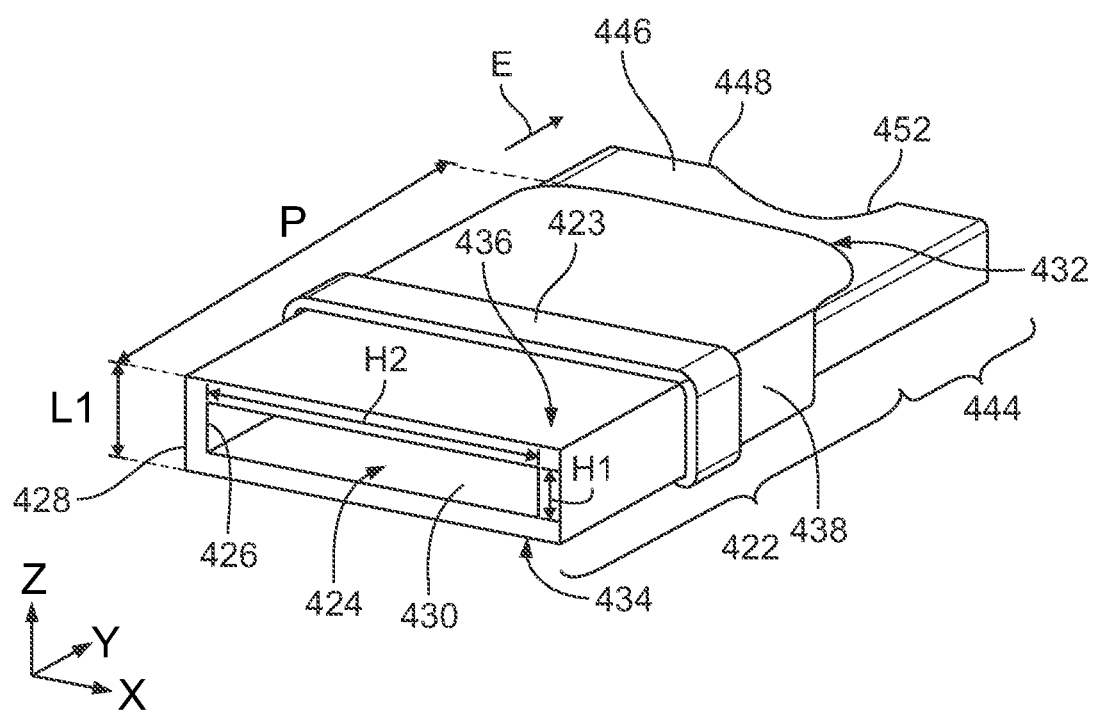
FIG. 10 is a perspective view of a thermally conductive sleeve of the temperature measuring device of FIG. 9.

In another embodiment, shown in FIGS. 9 to 11, the flexible tab 46 extends from the second end 32 of the first thermally conductive portion 22. In another embodiment, at least two flexible tabs 46 extend from the first thermally conductive portion 22.

The flexible tab 46 may have a substantially rectangular shape. In this case, a contour of the free end 48 of the flexible tab 46 would be substantially straight in the plane of extension. Since it is the contour of the free end 48 of the flexible tab 46 that is intended to contact a terminal of an electrical connector (as explained below with reference to FIGS. 7 and 8), the geometry of the contour of the free end 48 can advantageously be made to match the shape (especially the circumference) and diameter of the connector terminal. The shape of the free end 48 thus depends on the shape of the electrical connector terminal of which the measuring device 10 is intended to determine the temperature and improves contact with the terminal, resulting in improved sensitivity and quality of the temperature measurement.

Various examples of the contour geometry of the free end 48 of the flexible tab 46 are shown in FIGS. 4A to 4D in the plane of extension, i.e. according to a top view of the flexible tab 46 in the plane (XY). In each of these examples, the contour of the free end 48 of the flexible tab 46 is substantially concave in shape.

Figure 4A:
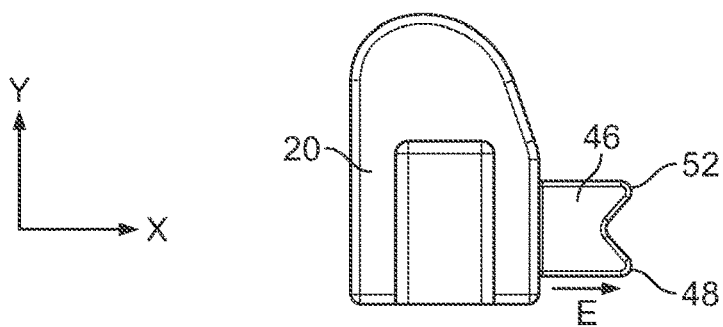
FIG. 4A is a top view of the thermally conductive sleeve of FIG. 3.

The thermally conductive sleeve 20 according to the first embodiment, shown in FIG. 4A, as well as FIGS. 2 and 3, comprises a flexible tab 46 with a free end 48 that has a "V" shaped contour 52 in the plane of extension (XY).

Figure 4B:
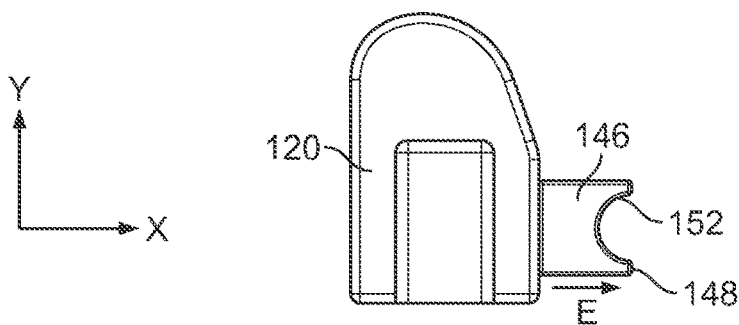
FIG. 4B is a top view of a thermally conductive sleeve according to a second embodiment.

FIG. 4B illustrates a thermally conductive sleeve 100 according to a second embodiment. The thermally conductive sleeve 100 comprises a flexible tab 146 with a free end 148 that has a concave contour 152 of semicircular shape in the plane of extension (XY). The radius of said semicircular shape is intended to be adapted to the radius of a terminal of which the measuring device 10 is configured to determine its temperature.

Figure 4C:
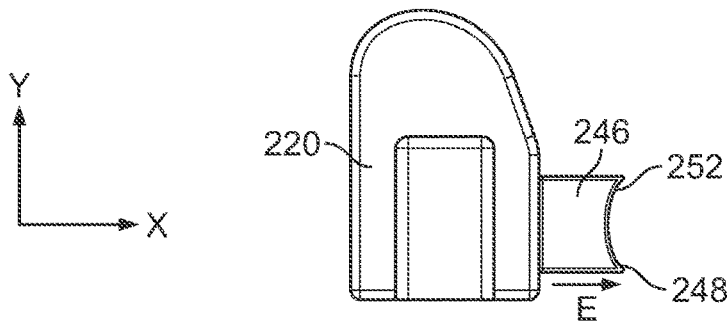
FIG. 4C is a top view of a thermally conductive sleeve according to a third embodiment.

FIG. 4C illustrates a thermally conductive sleeve 200 according to a third embodiment. The thermally conductive sleeve 200 comprises a flexible tab 246 with a free end 248 that has a concave contour 252 with a semi-elliptical shape in the extension plane (XY). The dimensions of said semi-elliptical shape are intended to be adapted to the dimensions, in particular the circumference dimensions, of a terminal of which the measuring device 10 is configured to determine its temperature.

Figure 4D:
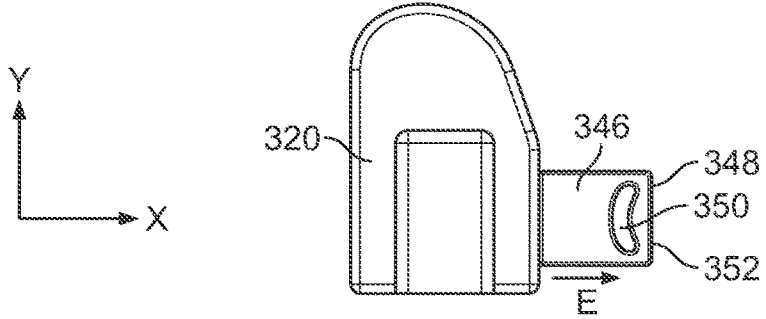
FIG. 4D is a top view of a thermally conductive sleeve according to a fourth embodiment.

FIG. 4D illustrates a thermally conductive sleeve 300 according to a fourth embodiment. The thermally conductive sleeve 300 comprises a flexible tab 346 provided with a cutout 350 at the free end 348. The cutout 350 does not begin directly from the free end 348 but corresponds to an aperture 350 cut into the flexible tab 346 proximate the free end 348. The shape of the cutout 350 is not limited to the geometry shown in FIG. 4D.

In the fourth embodiment of FIG. 4D, the contour 352 has a straight shape because the free end 348 has a rectangular shape. The presence of the cutout 350 allows the free end 348 to have a concave contour 352 when the free end 348 is bearing against a wall, for example of a terminal of an electrical connector. Indeed, when bearing against a wall of a terminal, the free end 348 is deformed so as to at least partially close the aperture 350. Since the cutout 350 is concave in shape, this generates a concave contour 352 at the free end 348.

The present invention is not limited to the geometries illustrated in FIGS. 4A to 4D but also relates to any other type of concave contour.

Figure 5:
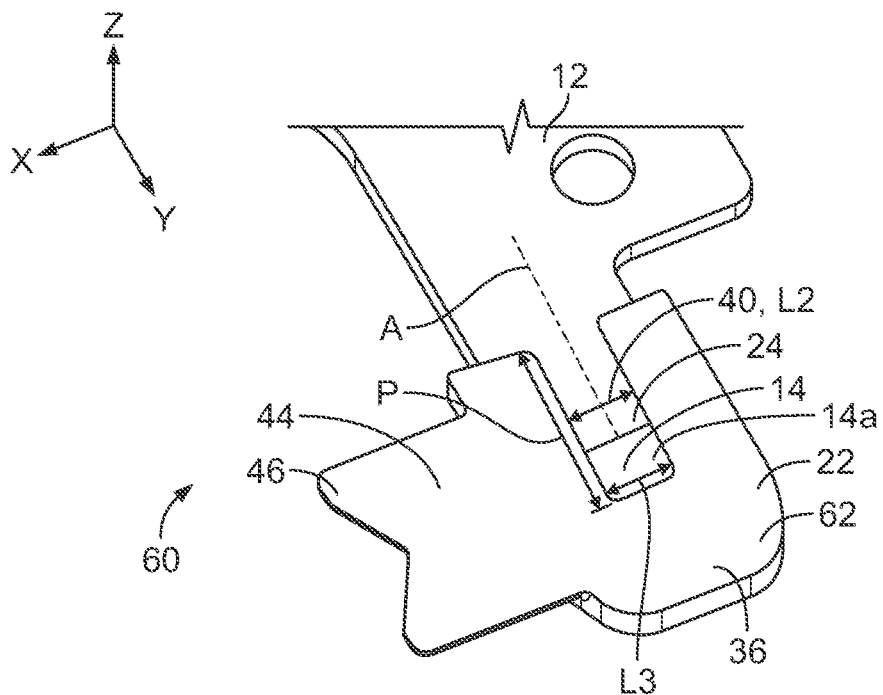
FIG. 5 is a perspective view of a temperature measuring device comprising a thermally conductive sleeve according to a fifth embodiment.

FIG. 5 depicts a temperature measurement device 60 comprising a thermally conductive sleeve 62 according to a fifth embodiment of the invention. The elements with the same numerical references already used for the description of FIGS. 2 and 3 will not be described again in detail, and reference is made to their descriptions above.

The thermally conductive sleeve 62 according to a fifth embodiment of the invention has, like in the first embodiment, a first thermally conductive portion 22 comprising a groove 40 of width L2 that extends longitudinally along the depth direction P of the recess 24. The groove 40 opens into the recess 24. The width L2 of the groove 40 is adapted to the width L3 of the temperature sensor 14. Thus, the temperature sensor 14 can be received in the groove 40 of the thermally conductive sleeve 62.

Unlike the first embodiment, in the fifth embodiment shown in FIG. 5, the wall 36 does not form the bottom of a groove. Accordingly, in the fifth embodiment, the temperature sensor 14 is not integrally received in the first thermally conductive portion 22 of the thermally conductive sleeve 62. A surface 14a of the temperature sensor 14 is thus visible even when the thermally conductive sleeve 62 is slid over the PCB 12, as shown in FIG. 5, providing a visual indicator and means of verification.

Figure 6:
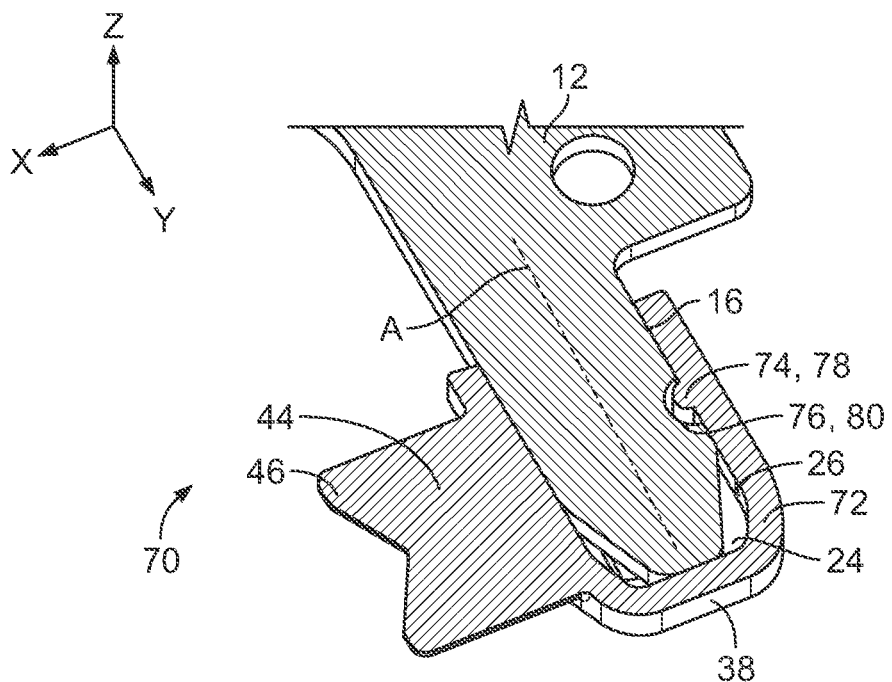
FIG. 6 is a sectional perspective view of a temperature measuring device according to a sixth embodiment.

FIG. 6 shows a cross-sectional view in a plane (XY) of a temperature measurement device 70 comprising a thermally conductive sleeve 72 according to a sixth embodiment of the invention. The elements with the same numerical references already used for the description of FIGS. 2 and 3 will not be described again in detail, and reference is made to their descriptions above.

The thermally conductive sleeve 72 according to a sixth embodiment of the invention shown in FIG. 6 comprises an inner wall 26 delimiting the recess 24 of the first thermally conductive portion 22, like in the first embodiment. According to the sixth embodiment of the invention, the inner wall 26 of the lateral side 38 of the first portion has a stop 74. The stop 74 is held in a form-fitting manner with a corresponding retention device 76 of the part 16 of the printed circuit board 12, on which the thermally conductive sleeve 72 is inserted.

According to the sixth embodiment of the invention, the stop 74 is formed by a protrusion 78 that projects toward the recess 24 from the inner wall 26. In the example illustrated in FIG. 6, the protrusion 78 has a semi-spherical shape. The corresponding retention device 76 is formed by a notch 80 of complementary shape to the protrusion 78. The notch 80 is formed in the part 16 of the printed circuit board 12. The notch 80 has a semicircular shape in the plane (XY) of the printed circuit board 12.

In another embodiment, the stop 74 and the retention device 76 may have a different geometry than shown in FIG. 6. In one embodiment, the circuit board part 16 may have a plurality of retention device 76.

Providing a form-fit connection is a simple and easy implementable solution for retaining the thermally conductive sleeve 72 to the circuit board 12, and unintentional disengagement of the thermally conductive sleeve 72 from the circuit board 12 can be prevented. This is particularly useful for applications in electric vehicles in which the temperature measurement device 70 may be subjected to shock and vibration. The thermally conductive sleeves 20, 120, 220, 320, 62 according to the previously described embodiments may also comprise a stop 74.

Figure 7:
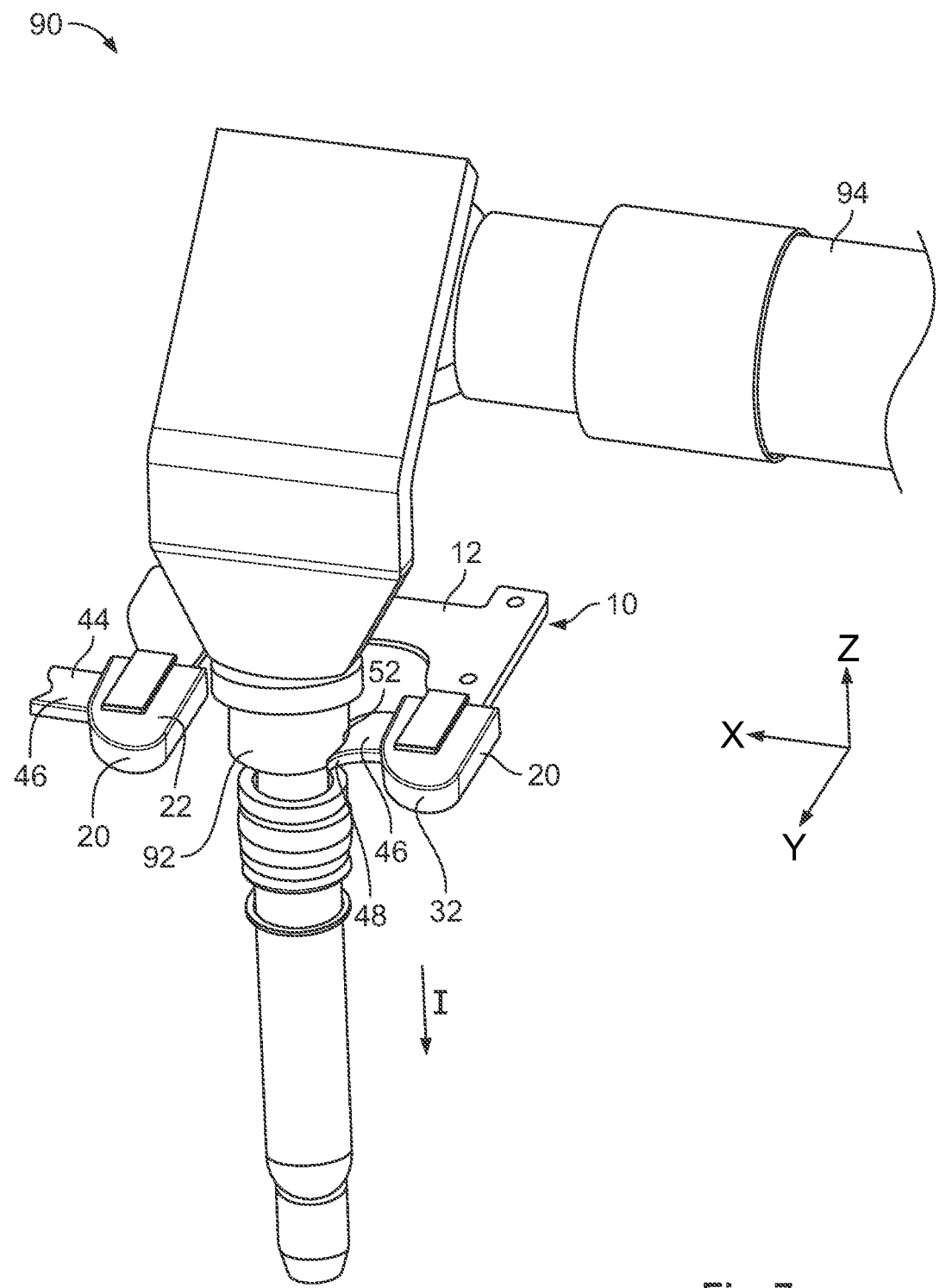
FIG. 7 is a perspective view of an assembly comprising a terminal of an electrical connector and the temperature measuring device according to the first embodiment.

FIG. 7 depicts a three-dimensional view of an assembly 90 comprising a terminal 92 of an electrical connector 94 and the temperature measurement device 10 according to the first embodiment of the invention. FIG. 8 shows a cross-sectional and top view of the assembly 90 shown in FIG. 7. FIGS. 7 and 8 are described together below. The elements with the same numerical references already used for the description of FIGS. 2 and 3 will not be described again in detail, and reference is made to their descriptions above.

In FIGS. 7 and 8, and as explained above with reference to FIGS. 2 and 3, the first thermally conductive portion 22 is in frictional connection with the part 16 of the printed circuit board 12. The thermally conductive sleeve 20 is thus held to the printed circuit board 12 by friction.

On the left side of FIG. 7, the thermally conductive sleeve 20 is shown in an initial, so-called unbent state, in which the flexible tab 46 is not bent. In the initial state, the flexible tab 46 extends in the plane of extension that corresponds to the plane (XY) of the printed circuit board 12. The second thermally conductive portion 44 of the flexible tab 46 is more flexible than the first thermally conductive portion 22, in particular because the first thermally conductive portion 22 receives part (16) of the printed circuit board 12 in its recess (not visible in FIG. 7), which gives it more rigidity than the second thermally conductive portion 44.

On the right side of FIG. 7, the thermally conductive sleeve 20 is shown in a bent state in which the flexible tab 46 is bent. In the bent state, the flexible tab 46 extends in a curved plane, which is thus not parallel to the plane (XY), the plane (XY) corresponding to the plane of the printed circuit board 12. Insertion of the terminal 92 along an insertion direction I perpendicular to the printed circuit board 12 and thus to the plane (XY), has the effect of bending the flexible tab 46 of the thermally conductive sleeve 20. Because the tab 46 is flexible and bendable, the operator encounters little resistance when inserting the terminal 92, which facilitates assembly.

The outline 52 of the free end 48 of the flexible tab 46 is in contact with the terminal 92, as shown in FIG. 8. Thermal transfer from the terminal 92 to the temperature sensor 14 is thus achieved via the flexible tab 46 and the first thermally conductive portion 22, which is in thermal contact with the temperature sensor 14.

The sleeve shape makes it possible to reduce heat losses during the heat transfer between the terminal 92 of the electrical connector 94 and the temperature sensor 14 via the thermally conductive sleeve 20. The silicone sleeve shape also allows increasing the creepage distance from the terminal 92 because the sleeve 20 electrically insulates the part 16 of the circuit board 12 covered by the sleeve 20. Advantageously, the position of the temperature sensor 14 on the printed circuit board 12 is chosen so as to limit the path followed by the thermal transfer in order to improve the sensitivity and quality of the temperature measurement.

FIG. 9 depicts a temperature measuring device 410 according to a seventh embodiment of the invention. Such a temperature measuring device 410 is intended to measure the temperature of a conductive component, in particular a terminal of an electrical connector, as shown in FIG. 11.

The temperature measurement device 410 comprises a PCB 412 having at least one temperature sensor mounted on a side 412b of the circuit board 412. Only one side 412a, geometrically opposite to the side 412b, is visible in FIG. 9, so the two temperature sensors of the seventh embodiment (one for each sleeve 420) are not visible in the view in FIG. 9. A temperature sensor 414 is, however, visible on a face 416b in the cross-sectional view of FIG. 11.

In an embodiment, the temperature sensors 414 are welded or soldered to a portion 416 of the circuit board 412 that has an elongated shape extending along a longitudinal axis A. The portion 416 terminates along the longitudinal axis A with a free end 418. The portion 416 shown in FIG. 9 has a rectangular shape along the longitudinal axis A with rounded or chamfered corners at the free end 418.

The plane of the circuit board 412 is parallel to the plane (XY) in the illustration in FIG. 9.

As in the sixth embodiment, the portion 416 of the circuit board 412 onto which the thermally conductive sleeve 420 is inserted comprises a retention device 476 formed by a notch 480. The notch 480 has a semicircular shape in the plane (XY) of the circuit board 412. In one embodiment, the portion 416 of the circuit board 412 may comprise a plurality of retention devices 476.

According to the present invention, the temperature measuring device 410 comprises a thermally conductive sleeve 420. It is noted that the two thermally conductive sleeves 420 shown in FIG. 9, the thermally conductive sleeve 420 shown in FIG. 10, and the thermally conductive sleeve 420 shown in FIG. 11, are identical to each other. In an embodiment, the sleeve 420 is a thermally conductive silicone sleeve, i.e. capable of transferring heat but does not conduct electricity. It can thus serve as an electrical insulator.

FIG. 9 illustrates on the left a thermally conductive sleeve 420 in position to be slid, i.e. slidably engaged to the portion 416 of the circuit board 412 along an insertion direction D.

On the right side of FIG. 9, the other thermally conductive sleeve 420 is already slid over the part 416 of the PCB 412 so that the temperature sensor is in thermal contact with the thermally conductive sleeve 420. The thermally conductive sleeve 420 is then in frictional engagement with the part 416 of the PCB 412, thereby retaining the thermally conductive sleeve 420 to the circuit board 412.

As in the sixth embodiment, the thermally conductive sleeve 420 comprises a stop, such as a protrusion, that is retained in a form-fit manner with the corresponding retention device 476 of the portion 416 of the printed circuit board 412 onto which the thermally conductive sleeve 420 is inserted. The form-fit connection prevents unintentional disengagement of the thermally conductive sleeve 420 from the portion 416. This is especially useful for applications in electric vehicles in which the temperature measuring device 410 may be subjected to shock and vibration.

The thermally conductive sleeve 420 according to the seventh embodiment is further described in the following with reference to FIG. 9 as well as with reference to FIG. 10, which depicts a three-dimensional view of the thermally conductive sleeve 420 providing more detail.

The thermally conductive sleeve 420 comprises a first thermally conductive portion 422 and a second thermally conductive portion 444, shown in FIG. 10. The first thermally conductive portion 422, as in the first embodiment, comprises a recess 424 (visible in FIG. 10) into which part 416 of the circuit board 412 can be slid. The dimensions of the recess 424 are thus adapted to the dimensions of the portion 416 and the height of the temperature sensor (a temperature sensor 414 is visible in the cross-sectional view in FIG. 11).

The recess 424 is delimited by an inner wall 426 of the first thermally conductive portion 422, as shown in FIG. 10. The recess 424 extends in depth along a depth direction P from a first end 428 of the first thermally conductive portion 422. The first end 428 of the first thermally conductive portion 422 thereby comprises an opening 430 that is opened into the recess 424. According to the seventh embodiment, the opening 430 is rectangular.

The depth of the recess 424 is indicated by the letter "P" in FIG. 10. The depth P of the recess 424 extends from the first end 428 in a direction parallel to the Y-axis of the Cartesian coordinate system shown in FIG. 10. The depth P of the recess 424 is parallel to the insertion direction D (shown in FIG. 9).

The first thermally conductive portion 422 can thus be slid along the insertion direction D on the part 416 of the printed circuit board 412 over a length corresponding to the depth P of the recess 424. The length of the depth P may be defined, in particular increased, in order to improve the retention of the thermally conductive sleeve 420 or/and for increasing the creepage distance (by increasing the distance covered by the thermally conductive silicone insulating sleeve 420).

As explained above with reference to the thermally conductive sleeve 420 shown on the right side of FIG. 9, once the thermally conductive sleeve 420 is engaged (by sliding along the insertion direction D) to the printed circuit board 412, there is a frictional contact, or frictional engagement, between a surface 416a, 416b of the printed circuit board portion 416 and the inner wall 426 of the recess 424 of the first thermally conductive portion 422. This frictional contact creates a frictional connection that retains the thermally conductive sleeve 420 to the part 416 of the circuit board portion 412.

The first thermally conductive portion 422 comprises a second end 432 opposite the first end 428 along the depth direction P (i.e. along the Y-axis of the Cartesian coordinate system shown in the FIG. 10).

In the first embodiment, the second end 432 is a closed end 432, i.e. an end without an opening. The second closed end 432 reduces heat loss and thus improves heat transfer, improving sensitivity and quality of the temperature measurement. The second closed end 432 can also serve as an indicator for an operator when mounting the thermally conductive sleeve 420 to the circuit board 412 because it provides a stop, like an abutment, which indicates to the operator that the thermally conductive sleeve 420 has been sufficiently slid onto the part 416.

The second closed end 432 implies that the recess 424 has a closed end (visible in the cross-sectional view of FIG. 11) opposite the opening 430 along the depth P of the recess 424. Once the thermally conductive sleeve 420 is slid into a final position, as illustrated by the cross-sectional view of FIG. 11, the free end 418 abuts against the inner wall 426 at said closed end of the recess 424.

In a plane (XY) as shown in FIG. 10, the first thermally conductive portion 422 has a substantially rectangular shape at the first end 428 and a convex shape at the second end 432. In a variant, the second end 432 may have a substantially rectangular shape.

The first thermally conductive portion 422 is substantially flat with a thickness L1 between two geometrically opposed walls 434, 436 that each extend in planes (XY) parallel to each other, as shown in FIG. 10. When the thermally conductive sleeve 420 is mounted on the PCB 412, as shown on the right side of FIG. 9, the walls 434, 436 extend in planes parallel to the plane (XY) in which the PCB 412 and its portion 416 extend. The two opposing walls 434, 436 of the first thermally conductive portion 422 are joined together by a lateral side 438.

According to the seventh embodiment, and unlike the first embodiment and the fifth embodiment, the wall 436 of the first thermally conductive portion 422 does not comprise a longitudinal groove.

Thus, in the seventh embodiment, the recess 424 has a rectangular cross-section with a width H1 and a length H2, as shown in FIG. 10. The width H1 corresponds to the overall height H4 (only visible in the cross-sectional view of FIG. 11) of the portion 416 and the temperature sensor 414 welded or soldered to the PCB 412. The length H2 corresponds to the width H3 of the part 416 of the circuit board 412, shown in FIG. 9.

According to the seventh embodiment and unlike the first embodiment and the fifth embodiment, the first portion 422 is provided with a collar 423, shown in FIGS. 9-11, formed by a shoulder 423 projecting from an outer wall (comprising the walls 434, 436, 438) of the first portion 422 around the outer circumference of the first portion 422. The collar 423 serves to mechanically reinforce the first portion 422 and provide an element for an operator to installing the thermally conductive sleeve 420 on the circuit board 412.

According to the seventh embodiment, and as in the first embodiment, the temperature sensor 414 is integrally received within the first thermally conductive portion 422 of the thermally conductive sleeve 420, as shown in FIG. 11. This not only protects the temperature sensor from the environment, but also further improves the thermal contact between the temperature sensor 414 and the thermally conductive sleeve 420.

According to the present invention, the thermally conductive sleeve 420 further comprises a second thermally conductive portion 444, shown in FIG. 10. The second thermally conductive portion 444 forms a flexible thermally conductive tab 446 that extends along an extension direction E from the first portion 422 to contact a terminal of an electrical connector (shown in FIGS. 7 and 8).

The flexible tab 446, which has a substantially flat shape, extends in an extension plane. Said extension plane corresponds to the plane of extension (XY) in the embodiment of FIGS. 9 and 10. When the thermally conductive sleeve 420 is mounted on the circuit board 412, as shown on the right side of FIG. 9, the extension plane of the flexible tab 446 is parallel to the plane (XY) in which the circuit board 412 and its portion 416 extend. Because the flexible tab 446 is flexible, it can be deformed or even bent or folded. Thus, the flexible tab 446 is flexible.

According to the seventh embodiment, the flexible tab 446 extends from the closed end 432 of the first thermally conductive portion 422 to a free end 448 of the flexible tab 446. Accordingly, the direction of extension E according to the seventh embodiment, unlike the other embodiments, is parallel to the depth direction P of the recess 424 of the first thermally conductive portion 422 of the thermally conductive sleeve 420.

The flexible tab 446 may have a substantially rectangular shape. In this case, a contour of the free end 448 of the flexible tab 446 would be substantially straight in the plane of extension.

Since it is the contour of the free end 448 of the flexible tab 446 that is intended to contact a terminal of an electrical connector (as previously explained with reference to FIGS. 7 and 8), the geometry of the contour of the free end 448 can be made according to the shape (in particular, the circumference) and diameter of the connector terminal. The shape of the free end 448 thus depends on the shape of the electrical connector terminal of which the measuring device 410 is intended to determine the temperature.

In the seventh embodiment, the thermally conductive sleeve 420 comprises a flexible tab 446 with a free end 448 that has a concave semi-elliptical contour 452 in the extension plane (XY).

FIG. 11 depicts a cross-sectional view of an assembly comprising a terminal 92 of an electrical connector and the temperature measurement device 410 according to the seventh embodiment of the invention. The elements with the same numerical references already used for the description of FIGS. 9 and 10 will not be described again in detail, and reference is made to their descriptions above.

The thermally conductive sleeve 420 is shown in cross-section in a bent state in FIG. 11 in which the flexible tab 446 is bent. In the bent state, the flexible tab 446 extends in a curved plane, which is not parallel to the plane (XY) or to the plane of the printed circuit board 412.

Because the flexible tab 446 according to the seventh embodiment is shorter along the direction of extension E than the tab 46 according to the first embodiment, and extends from the closed end 432 (and not from the lateral side 438), the flexible tab 446 is less bent by the insertion of the terminal 92 compared to the first embodiment. Nonetheless, insertion of the terminal 92 along an insertion direction I perpendicular to the circuit board 412, and thus to the plane (XY), results in the flexible tab 446 of the thermally conductive sleeve 420 being bent. Because the tab 446 is flexible and bendable, the operator encounters little resistance when inserting the terminal 92, which facilitates assembly.

The contour 452 of the free end 448 of the flexible tab 446 is in contact with the terminal 92, as shown in FIG. 11. A thermal transfer from the terminal 92 to the temperature sensor 414 is thus achieved via the flexible tab 446 and the first thermally conductive portion 422, which is in thermal contact with the temperature sensor 414.

Thanks to the sleeve shape, it is possible to reduce the heat loss during the heat transfer between the terminal 92 of the electrical connector and the temperature sensor 414 via the thermally conductive sleeve 420. This results in improved sensitivity and quality of the temperature measurement of the electrical connector terminal 92. The silicone sleeve shape also allows increasing the creepage distance from the terminal 92 because the sleeve 420 electrically insulates the portion 416 of the PCB 412 covered by the sleeve 420. In an embodiment, the position of the temperature sensor 414 on the printed circuit board 412 is selected so as to limit the path followed by the thermal transfer in order to improve the sensitivity and quality of the temperature measurement.

The various embodiments described above can be combined with each other.

The temperature measuring device according to the above-described embodiments provide a more accurate temperature measurement than is possible in the state of the art, especially in applications with high amperage (especially with values of 200 A or more) and high voltages, i.e., above 200V or even 1000V, and is a simple solution to implement.

What is claimed is:

1. A temperature measuring device for measuring a temperature of a terminal of an electrical connector, comprising:
a printed circuit board;
a temperature sensor mounted on the printed circuit board; and
a thermally conductive sleeve having a first thermally conductive portion and a second thermally conductive portion, the first thermally conductive portion having a recess receiving a part of the printed circuit board, the first thermally conductive portion is in thermal contact with the temperature sensor, the second thermally conductive portion forms a flexible tab extending from the first thermally conductive portion and contacting the terminal, the flexible tab extends in a plane of the printed circuit board from a lateral side of the first thermally conductive portion in an extension direction that is perpendicular to a depth direction of the recess.

2. The temperature measuring device of claim 1, wherein a free end of the flexible tab has a concave shape.

3. The temperature measuring device of claim 1, wherein the first thermally conductive portion has a wall with a groove extending parallel to the depth direction of the recess and parallel to an insertion direction of the thermally conductive sleeve onto the part of the printed circuit board.

4. The temperature measuring device of claim 3, wherein the groove opens into the recess and the temperature sensor is received in the groove.

5. The temperature measuring device of claim 1, wherein the thermally conductive sleeve has an inner wall delimiting the recess of the first thermally conductive portion, the inner wall is held by a form-fit connection with the part of the printed circuit board.

6. The temperature measuring device of claim 5, wherein the inner wall has a protrusion projecting toward the recess and the part of the printed circuit board has a retention device formed by a notch.

7. The temperature measuring device of claim 1, wherein the first thermally conductive portion is in frictional connection with the part of the printed circuit board.

8. The temperature measuring device of claim 1, wherein the thermally conductive sleeve is formed of a thermally conductive silicone material.

9. The temperature measuring device of claim 1, wherein the first thermally conductive portion has an open end opening into the recess and a closed end opposite the open end along the depth direction of the recess.

10. The temperature measuring device of claim 1, wherein the temperature sensor is integrally received in the recess of the first thermally conductive portion.

11. A thermally conductive sleeve, comprising:
a first thermally conductive portion having a recess in which a part of a circuit board is received; and
a second thermally conductive portion forming a flexible tab that extends from the first thermally conductive portion, the flexible tab contacts a terminal of an electrical connector, the flexible tab extends from a lateral side of the first thermally conductive portion in an extension direction that is perpendicular to a depth direction of the recess.

12. The thermally conductive sleeve of claim 11, wherein a free end of the flexible tab has a concave shape.

13. The thermally conductive sleeve of claim 11, wherein the first thermally conductive portion and the second thermally conductive portion are formed of a thermally conductive silicone material.

14. The thermally conductive sleeve of claim 11, wherein the first thermally conductive portion has an open end opening into the recess and a closed end opposite the open end along the depth direction of the recess.

\* \* \* \* \*